US010213737B2

(12) United States Patent
Mohan

(10) Patent No.: US 10,213,737 B2
(45) Date of Patent: Feb. 26, 2019

(54) RAIL MOUNTING DESICCANT UNIT

(71) Applicant: Mohan Instrumentation Services Limited, Hartlepool, Cleveland (GB)

(72) Inventor: Daniel Mohan, Teesside (GB)

(73) Assignee: Mohan Instrumentation Services Limited, Hartlepool, Cleveland (GB)

(*) Notice: Subject to any disclaimer, the term of this patent is extended or adjusted under 35 U.S.C. 154(b) by 144 days.

(21) Appl. No.: 15/287,768

(22) Filed: Oct. 7, 2016

(65) Prior Publication Data
US 2017/0100698 A1   Apr. 13, 2017

(30) Foreign Application Priority Data

Oct. 9, 2015   (GB) .................................. 1517871.8

(51) Int. Cl.
| *B01D 53/26* | (2006.01) |
| *H05K 5/02* | (2006.01) |
| *H02B 1/052* | (2006.01) |
| *H02B 1/28* | (2006.01) |
| *B01D 53/28* | (2006.01) |

(52) U.S. Cl.
CPC ........... *B01D 53/261* (2013.01); *H02B 1/052* (2013.01); *H02B 1/28* (2013.01); *H05K 5/0213* (2013.01); *B01D 53/28* (2013.01); *B01D 2253/106* (2013.01)

(58) Field of Classification Search
CPC ...... B01D 53/261; B01D 53/28; H02B 1/052; H02B 1/28; H05K 5/0213

USPC ................ 96/117.5, 147, 148, 151; 206/204; 34/80, 472, 473
See application file for complete search history.

(56) References Cited

U.S. PATENT DOCUMENTS

| 3,559,382 | A | * | 2/1971 | Jaggard et al. ...... | B01D 53/261 174/14 R |
| 4,146,277 | A | * | 3/1979 | Santoro ................. | B01D 53/26 206/204 |
| 4,374,655 | A | * | 2/1983 | Grodzka ................ | F24F 3/1411 96/112 |
| 4,594,082 | A | * | 6/1986 | Catherwood, Sr. .. | B01D 53/261 55/318 |
| 5,009,308 | A | * | 4/1991 | Cullen ................. | B01D 53/0407 206/204 |
| 5,035,805 | A | * | 7/1991 | Freeman ............. | B01D 17/0202 210/282 |
| 5,189,581 | A | * | 2/1993 | Schroder ............. | G11B 23/50 206/204 |
| 5,191,721 | A | * | 3/1993 | Incorvia ............. | B01D 53/261 34/259 |

(Continued)

FOREIGN PATENT DOCUMENTS

| CN | 101415300 A | 4/2009 |
| CN | 201690172 U | 12/2010 |

(Continued)

*Primary Examiner* — Frank M Lawrence, Jr.
(74) *Attorney, Agent, or Firm* — James Creighton Wray; Meera P. Narasimhan

(57) ABSTRACT

There is provided apparatus for absorbing humidity inside an electrical enclosure and indicating absorption of humidity. The apparatus comprises a housing for a desiccant which is attachable to a rail inside the electrical enclosure, such as a DIN specification rail. The housing also includes a transparent window which allows the desiccant to be visualized.

17 Claims, 8 Drawing Sheets

(56) References Cited

U.S. PATENT DOCUMENTS

| | | | |
|---|---|---|---|
| 5,902,381 A * | 5/1999 | Golner | B01D 53/0407 96/108 |
| 6,767,521 B1 * | 7/2004 | Vogt | A61L 9/012 206/0.5 |
| 2005/0103195 A1 * | 5/2005 | Golner | B01D 53/0415 96/111 |
| 2005/0201893 A1 * | 9/2005 | Arno | B01D 53/04 96/117.5 |
| 2007/0234636 A1 * | 10/2007 | Schwartz | A01K 97/06 43/54.1 |
| 2011/0048976 A1 * | 3/2011 | Dick | B01D 53/261 206/204 |
| 2013/0063602 A1 | 3/2013 | Scapier | |
| 2013/0252043 A1 | 9/2013 | Allison | |

FOREIGN PATENT DOCUMENTS

| | | |
|---|---|---|
| CN | 202885856 U | 4/2013 |
| CN | 103124489 A | 5/2013 |
| CN | 203103870 U | 7/2013 |
| EP | 2648493 A1 | 10/2013 |
| JP | H04184149 A | 7/1992 |
| JP | 2004254479 A | 9/2004 |
| JP | 20111125173 A | 6/2011 |

* cited by examiner

RAIL MOUNTING DESICCANT UNIT

CROSS REFERENCE TO RELATED APPLICATIONS

This application claims priority from United Kingdom Patent Application No. 15 17 871.8, filed 9 Oct. 2015, the entire disclosure of which is incorporated herein by reference in its entirety.

BACKGROUND OF THE INVENTION

1. Field of the Invention

Excess humidity inside an electrical enclosure will ultimately result in damage to the electrical enclosure and the components housed within. The present invention relates to apparatus for absorbing humidity inside an electrical enclosure and indicating that humidity has been absorbed.

2. Description of the Related Art

Existing products on the market to counter the problem of excess humidity include air conditioning systems and heating systems. However, the installation and maintenance of such systems in every applicable electrical enclosure can be a monumental task, generally associated with a high procurement cost, high cost of installation and a high cost of maintenance. These systems present hazards themselves, for example, heating devices can overheat and cause significant damage whilst air-conditioning systems may leak inside an electrical enclosure.

A humidity detector for indicating humidity inside an electrical enclosure is known, but installation is required by drilling a hole in the side of the electrical enclosure. Drilling a hole within an enclosure adds to the possibility for a seal to break and thereby provide a path for elements of the external environment to enter an electrical enclosure. Retrofitting this type of unit is difficult because it requires a portable drill, thereby presenting an ignition risk due to the spark potential of the battery drill and the sparks and heat caused by drilling metallic electrical enclosures.

There is therefore no known product which safely addresses the problem of excess humidity inside electrical enclosures whilst also indicating a need for further investigation, without further jeopardizing the integrity of the electrical enclosure.

The apparatus of the present invention has no running costs, is non-flammable, non-toxic, easily retrofitted, easily maintained and is designed to be mounted on a rail inside an electrical enclosure specifically intended for enclosure components.

BRIEF SUMMARY OF THE INVENTION

According to an aspect of the present invention, there is provided apparatus for absorbing humidity inside an electrical enclosure and indicating absorption of said humidity, comprising: a housing for a desiccant; wherein said housing is configured for attachment to a rail inside said electrical enclosure; and said housing comprises a transparent window.

According to a second aspect of the present invention, there is provided a method of attaching apparatus for absorbing humidity inside an electrical enclosure and indicating absorption of said humidity to a rail inside said electrical enclosure, comprising the following steps: i) inserting a bolt into channel on said housing; ii) tightening said bolt within said channel using a tool; iii) allowing said bolt to engage with a clamp mechanism at base of said channel; and iv) drawing said clamp mechanism towards housing.

DETAILED DESCRIPTION OF EXAMPLE EMBODIMENTS

FIG. 1

Figure 1:
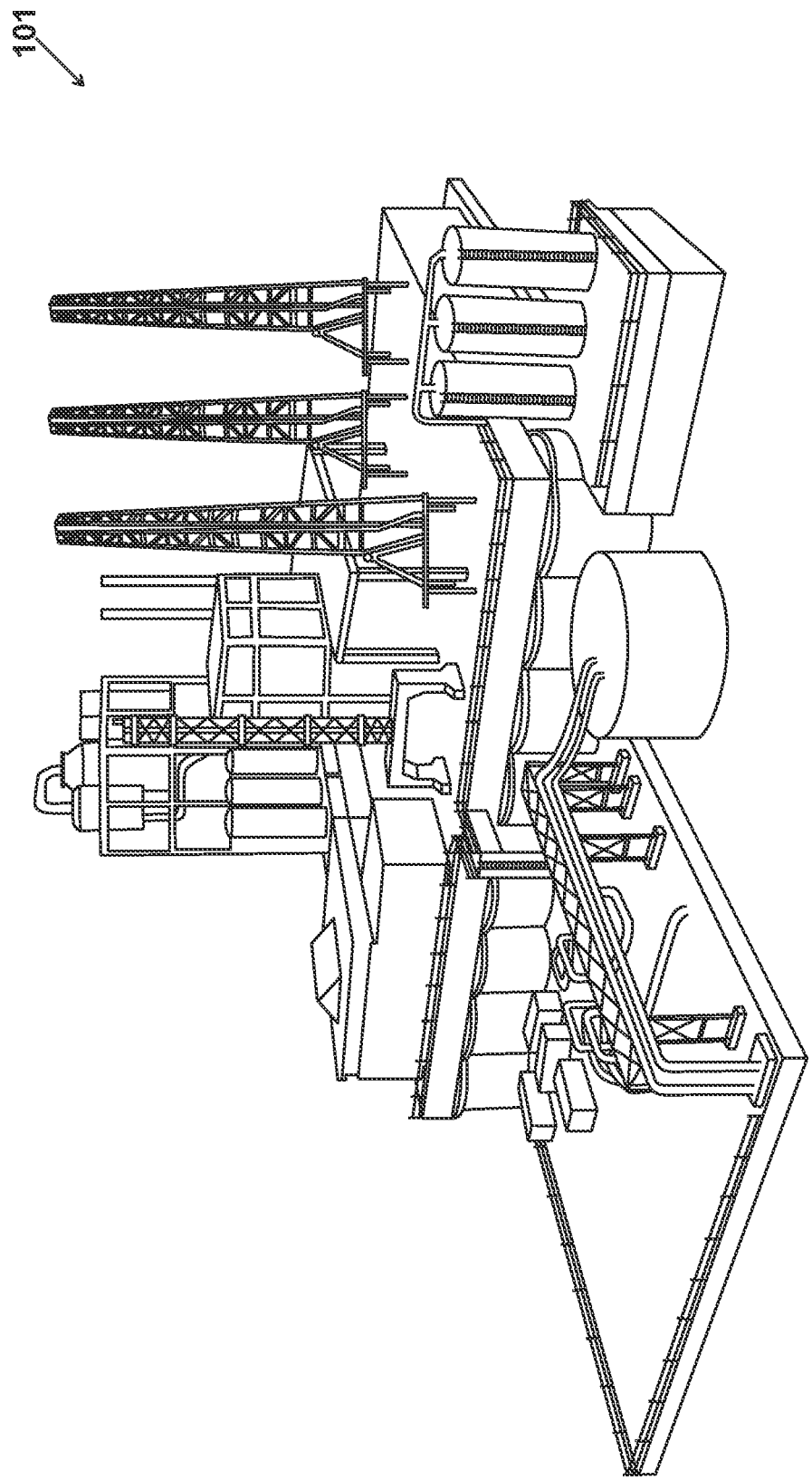
FIG. 1 shows an environment in which the present invention may be deployed.

The present invention may be deployed in any electrical enclosure. Electrical enclosures house the switches and displays of electrical and electronic equipment. An example of an environment in which there are large numbers of electrical enclosures is chemical plant 101, as shown in FIG. 1. Other examples may be food production plants, steel plants, oil/gas platforms, oil/gas process plants and power stations.

FIG. 2

Figure 2:
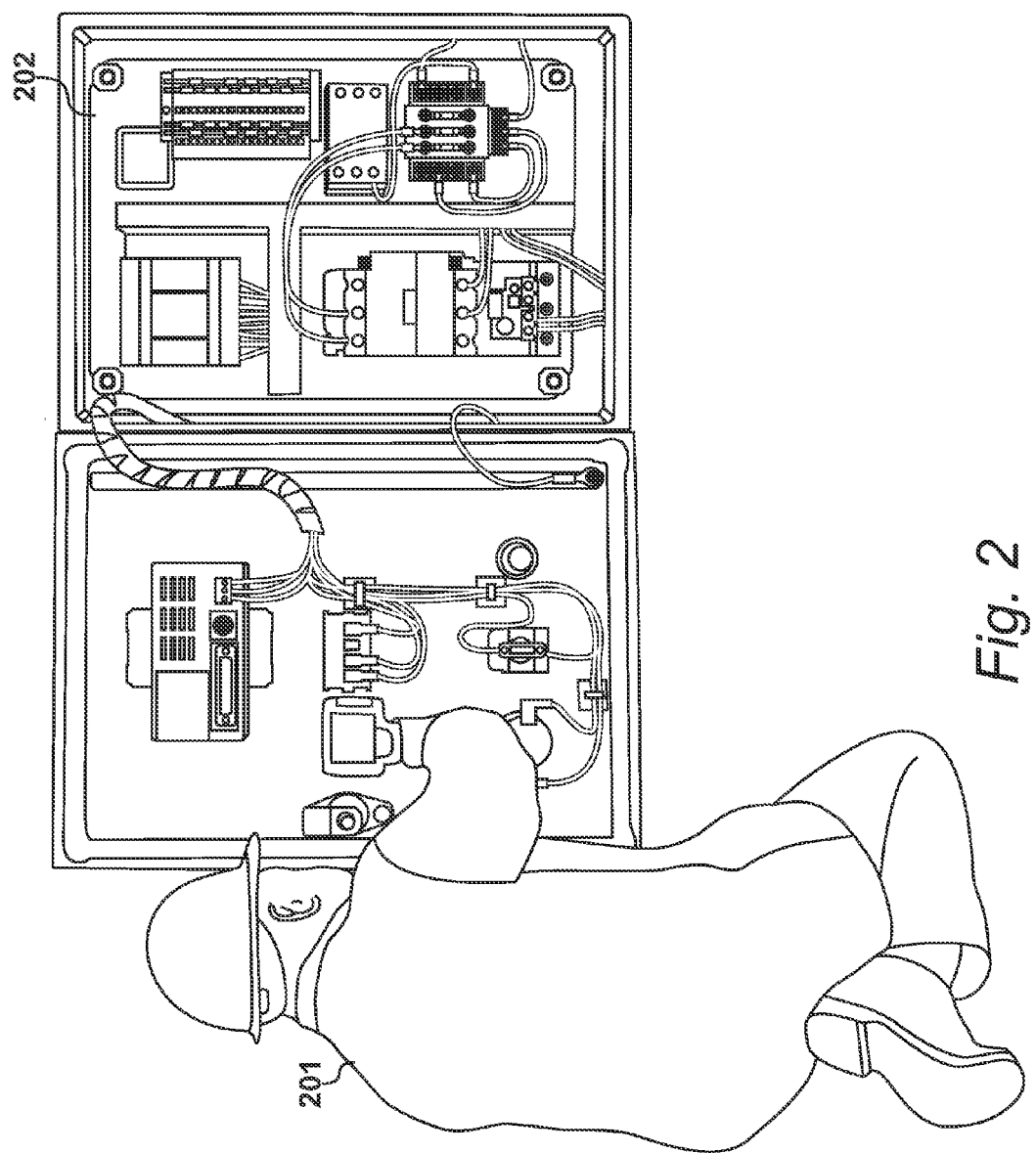
FIG. 2 shows an engineer checking the components in an electrical enclosure.

Engineer 201 checking the components in electrical enclosure 202 is shown in FIG. 2. Electrical enclosures, such as enclosure 202, house the switches and displays of electrical and electronic equipment, prevent electrical shock to equipment users and protect the contents from the environment. Humidity can be a problem inside electrical enclosures. If excess humidity is left to condense, it will ultimately degrade components such as terminals and wiring cores, change contact resistance, cause flashovers and current fluctuations, thereby ultimately resulting in system failure.

Equipment inside electrical enclosures can have a significantly high procurement cost. Signal accuracy is of paramount importance because said signals may be operating safety equipment and/or platform production. Damage caused by excessive humidity within electrical enclosures can result in significant safety concerns and/or result in large financial implications due to loss of production if equipment fails.

FIG. 3

Figure 3:
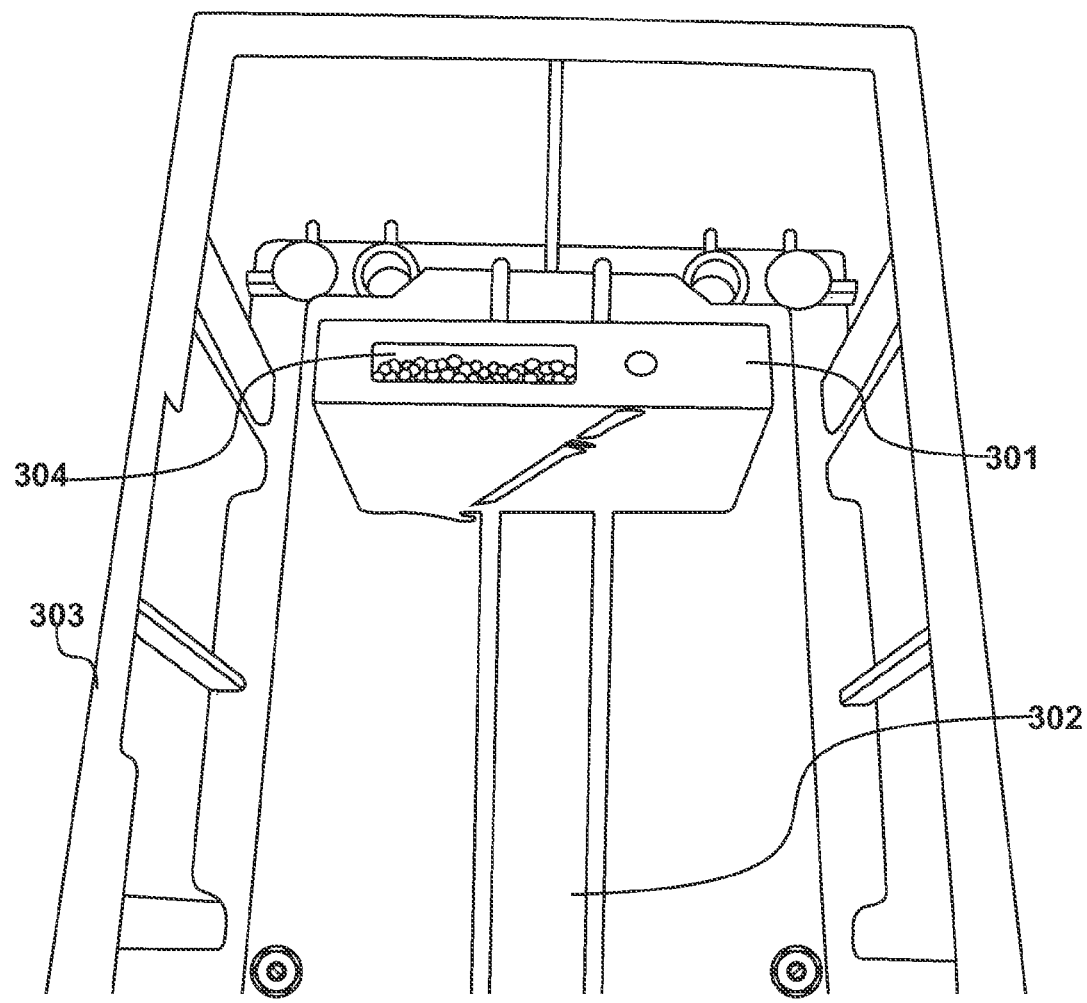
FIG. 3 shows a plan view of the embodied invention positioned inside an electrical enclosure.

The apparatus embodied in the present invention is shown in FIG. 3. Housing 301 is attached to a rail 302 inside electrical enclosure 303. The rail is typically a DIN rail which is an industry standard rail used in industry inside electrical enclosures. It is appreciated that other similar types of rail meeting alternative industry standards are within the scope of the present invention. Thus, where DIN rail is used in the specification, it should be interpreted to mean any suitable rail found inside an electrical enclosure.

An industry standard DIN rail is a metal rail typically used for mounting terminals, control equipment and circuit breakers inside equipment racks or electrical enclosures. A standard DIN rail is made from cold rolled carbon steel sheet with a zinc plated and chromated bright surface finish. The term is derived from the original specifications published by Deutsches Institut für Normung (DIN) in Germany. There are three main types of DIN rail, namely a top hat section DIN rail, a C section DIN rail and a G section DIN rail.

The apparatus embodied by the present invention comprises housing 301, which receives desiccant. Housing 301 is configured for attachment to DIN rail 302 inside electrical enclosure 303. Attachment of housing 301 to DIN rail 302 ensures that the desiccant is mounted in an area at the top of electrical enclosure 303.

The desiccant deployed by the present invention is used to absorb excess humidity from within the electrical enclosure. A certain amount of humidity may be desirable, as removal of all humidity may cause some items to become brittle. However, as mentioned in connection with FIG. 2, if excess humidity is left to condense onto surfaces, it will degrade components, ultimately resulting in system failure.

Desiccants are known to absorb humidity and a commonly used desiccant is silica gel. Previously, silica gel has been used inside new products, such as new shoes, bags, clothing and electronics to absorb humidity. Such silica gel is typically used in the form of sachets.

However, silica gel sachets cannot be used inside electrical enclosures because they would merely fall to the base of the enclosure. Furthermore, they do not provide an indication for when they have expired and require replacement. Generally given the same temperature and pressure, humid air rises compared to dry air. Consequently, housing 301 is required as a means to mount the desiccant at the top of the electrical enclosure.

Housing 301 comprises transparent window 304 for visualizing the desiccant. In the illustrated embodiment, transparent window 304 is used to visualize the change of color of the silica gel to allow a visual indication of when the silica gel has absorbed a particular amount of humidity and needs to be changed.

Most electrical enclosures adhere to a particular Ingress Protection rating (IP rating) in order to conform to industry standards. An example is IP64. The first digit makes reference to solids whilst the second digit makes reference to liquids. Clearly, the latter digit is of relevance with regards to the present invention. Therefore, taking an IP rating of 61, 1 protects only against vertically falling drops of water; for an IP rating of 64, 4 protects against splashes of water whereas for an IP rating of 68, 8 protects against long periods of immersion under water at pressure. The apparatus embodied by the present invention can indicate when a particular IP rating is not being adhered to, possibly because a seal on an electrical enclosure or a cable gland (where electrical wires enter the enclosure) has been compromised. Importantly, because the apparatus of the present invention can be used to indicate when an IP rating is not being adhered to or when other humidity control devices are not functioning, it can act as an early warning system to signify the need for further investigation.

Many electrical enclosures such as junction boxes may be checked on an annual basis although other electrical enclosures containing, for example, life-saving equipment, may be checked every month. Therefore, the checking and replacement of the desiccant in the apparatus embodied in the present invention may be incorporated into routine checks of electrical enclosures.

FIG. 4

Figure 4A:
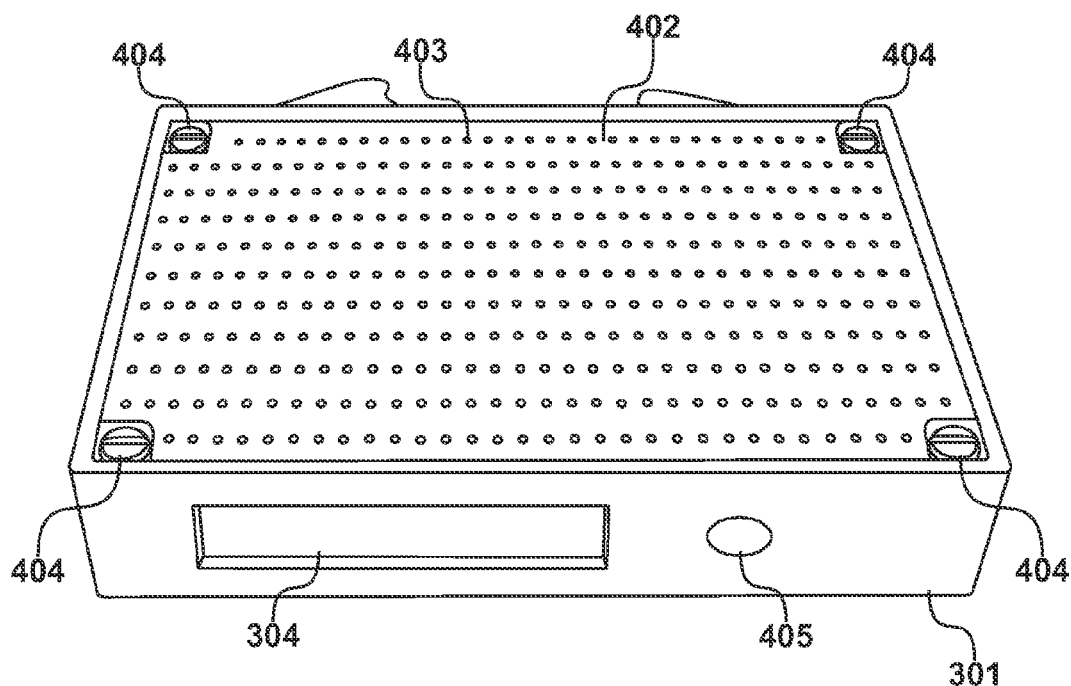
FIGS. 4A and 4B illustrate the embodied invention from two different viewpoints.
Figure 4B:
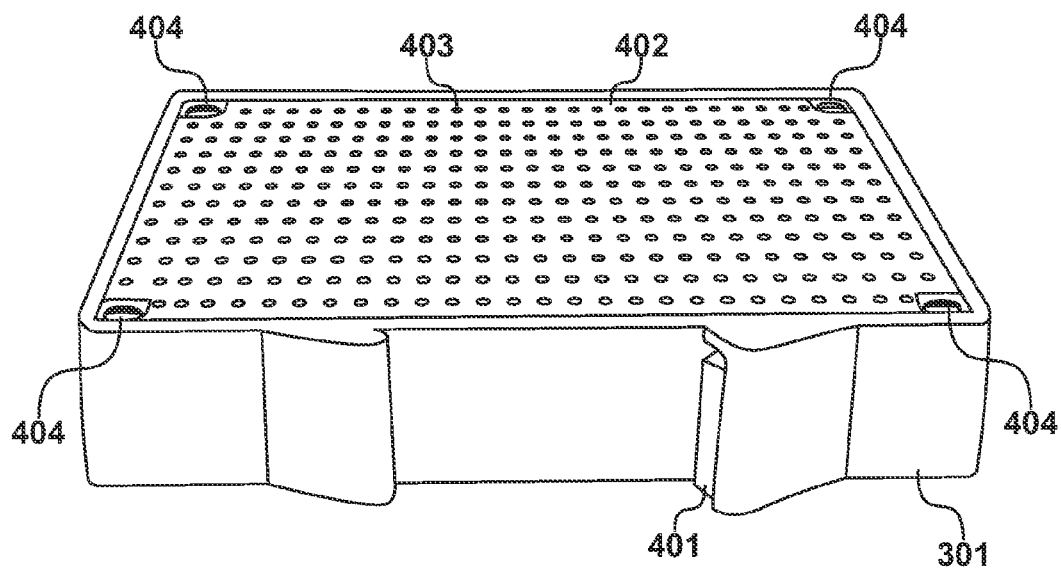

An external view of housing 301 embodied in the present invention showing transparent window 304 is illustrated in FIG. 4A, whilst an alternative view of the external surface of housing 301 embodied in the present invention is shown in FIG. 4B. Housing 301 is configured for attachment to a DIN rail (not herein shown), and in FIG. 4B, clamp mechanism 401 is shown for attaching housing 301 to the DIN rail.

The present invention thus provides housing 301 for mounting onto a DIN rail inside an electrical enclosure such as a junction box. A DIN rail is a designated method of mounting inside an electrical enclosure and anything required inside an electrical enclosure, such as terminals for cables entering the enclosure, is fixed to a DIN rail. The housing embodied in the present invention is configured for attachment to a top hat section DIN rail, but configurations of alternative types of DIN rail fall within the scope of the present invention. Therefore, the housing embodied in the present invention is suitable for mounting onto any type of DIN rail, although modifications to the housing and clamp mechanism that are within the ambit of the skilled person may be required for mounting onto certain rails.

FIGS. 4A and 4B show lid 402 of the apparatus embodied in the present invention. Lid 402 comprises a number of holes 403, as shown in FIGS. 4A and 4B. In the illustrated embodiment, there are approximately four hundred to five hundred holes and holes 403 have an approximate diameter of half a millimeter (0.5 mm). Holes 403 function to provide air ventilation to ensure that the air inside the electrical enclosure does pass over the desiccant and that the desiccant absorbs humidity and passes on the humidity from the top layer downwards. Holes 403 are approximately half a millimeter (0.5 mm) in diameter to ensure that the desiccant does not fall out of housing 301 through air ventilation holes 403. Silica gel, when used as a desiccant in bead form, is typically between two millimeters (2 mm) and five millimeters (5 mm) in diameter.

Lid 402 comprises four screws 404 for removing lid 402, to allow replacement of desiccant. A tool such as a screwdriver is required to open lid 402 of housing 301 to remove spent desiccant and replace with fresh desiccant.

The same tool as is used for opening lid 402 of housing 301 is inserted into channel 405. As explained in connection with FIGS. 6A and 6B, the tool is inserted into channel 405 to tighten a bolt (not herein shown), which engages with clamp mechanism 401. Clamp mechanism is drawn towards housing 301, thereby clamping housing 301 onto the DIN rail.

In the illustrated embodiment, housing 301 is fabricated from a polycarbonate material which itself has a very low rate of humidity absorption and a very low rate of shrinkage. The latter feature is important as it increases the accuracy of the final size of housing 301 during the injection molding process. Transparent window 304 is fabricated from a polycarbonate and all other components from stainless steel.

FIG. 5

Figure 5A:
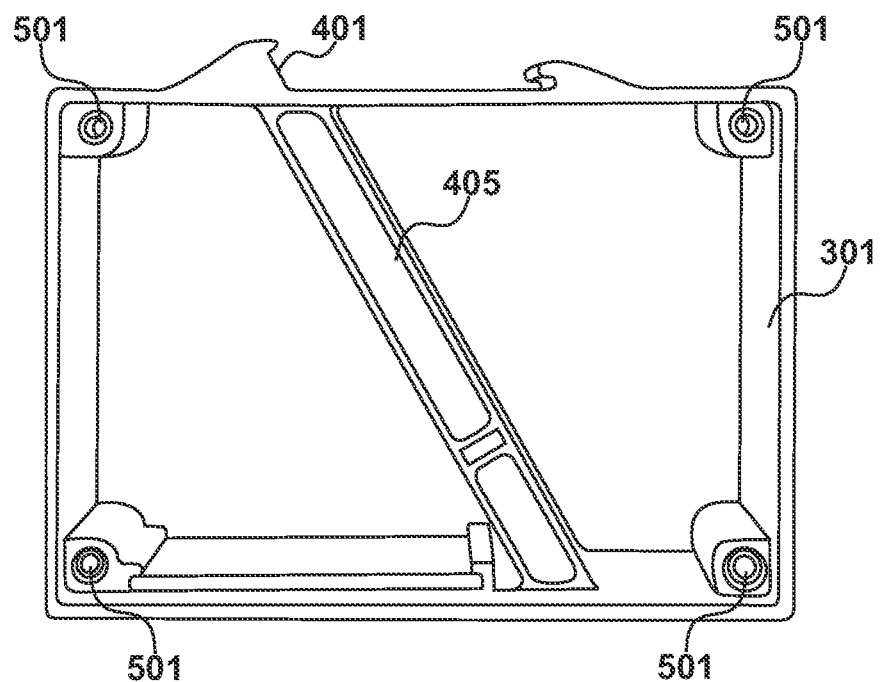
FIGS. 5A and 5B show a plan view of the interior of the embodied invention in an empty state and a state full of desiccant respectively.

In FIG. 5A, lid 402 of the present invention has been removed, revealing the interior of the embodied apparatus in an empty state. In FIG. 5A, there is no desiccant within the apparatus. Holes 501 represent the holes for receiving screws 404 (not herein shown) for attaching lid 402 (not herein shown) to housing 301 once housing 301 has been refilled with desiccant. Channel 405 is shown in FIG. 5A. As explained in connection with FIGS. 6A and 6B, a tool such as a screwdriver is inserted into channel 405 to tighten a bolt (not herein shown), which engages with clamp mechanism

401. Clamp mechanism is drawn towards housing 301, thereby clamping housing 301 onto the DIN rail.

Figure 5B:
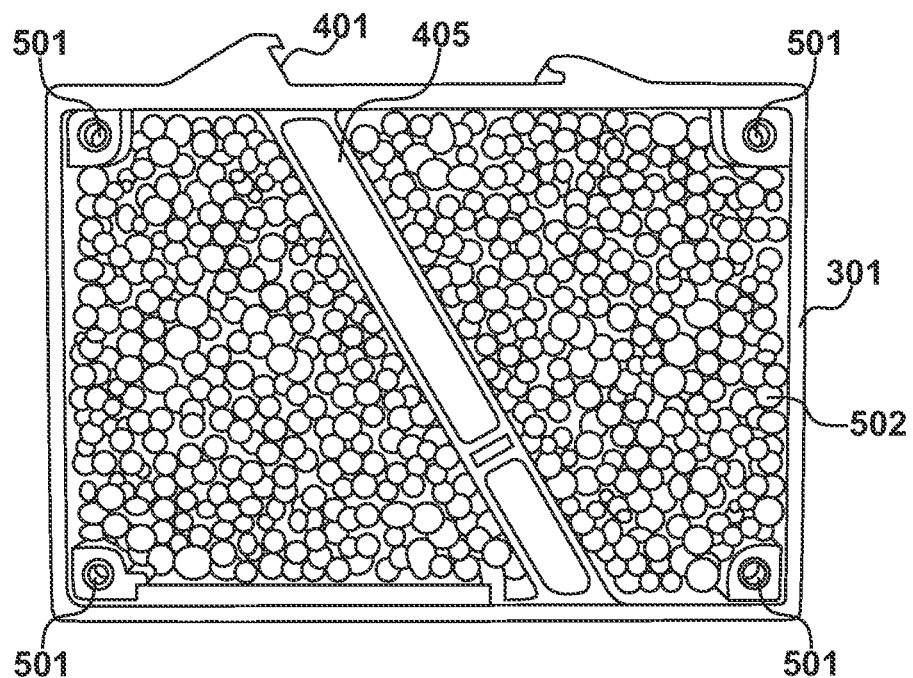

In FIG. 5B, lid 402 (not herein shown) of the claimed apparatus has been removed, revealing the interior of housing 301. Holes 501 represent the holes for receiving screws 404 (not herein shown) for attaching lid 402 (not herein shown) to housing 301 once housing 301 has been re-filled with desiccant.

Channel 405 is shown in FIG. 5B. As explained in connection with FIGS. 6A and 6B, a tool such as a screwdriver is inserted into channel 405 to tighten a bolt (not herein shown), which engages with clamp mechanism 401. Clamp mechanism is drawn towards housing 301, thereby clamping housing 301 onto the DIN rail.

In the illustrated embodiment, housing 301 is full of silica gel in a bead form 502. Although silica gel in a bead form 502 is used in the illustrated embodiment, any other desiccant falls within the scope of the present invention. Other desiccants may include, for example, Montmorillonite Clay, Molecular Sieve, Calcium Sulfate etc.

Silica gel only absorbs a certain amount of water, and this is up to forty percent (40%) of its own weight. Therefore, as an example, fifty grams (50 g) of silica gel would absorb around twenty grams (20 g) of water vapor. It is therefore possible to calculate how much silica gel by weight to place in housing 301 to absorb a specific amount of humidity.

Several types of silica gel are known that undergo different color changes. In the illustrated embodiment, the type of Silica gel used is that which changes from orange to clear, but other types of silica gel which change, for example, from orange to green, are also within the scope of the invention.
FIG. 6

Figure 6A:
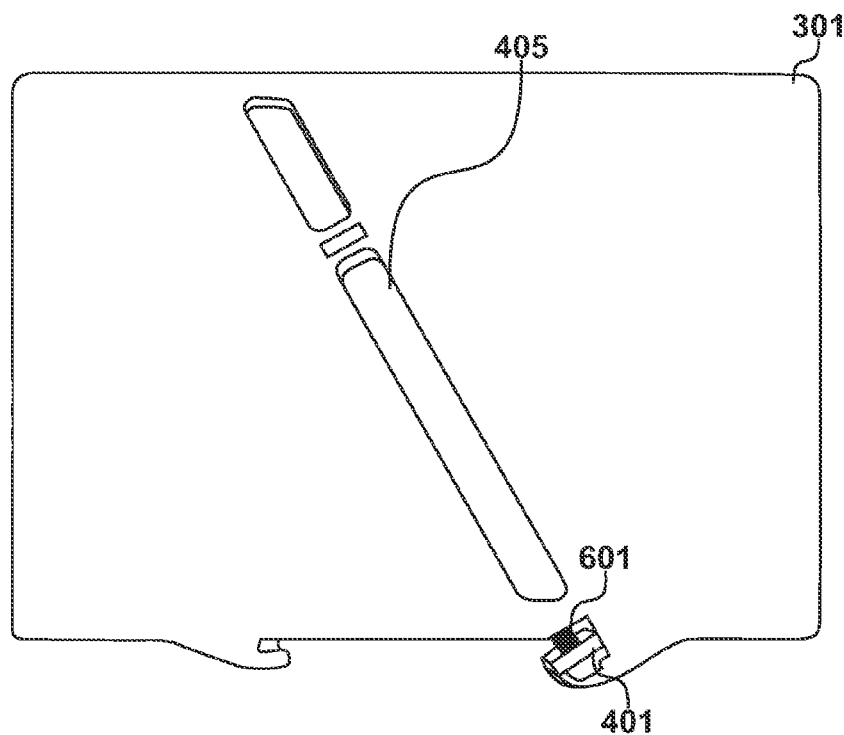
FIGS. 6A and 6B illustrate the mechanism by which the housing embodied in the present invention is clamped onto an industry standard DIN rail.

FIG. 6A shows channel 405. Channel 405 is configured for receiving bolt 601 and at the base of channel 405 is clamp mechanism 401. Channel 405 receives bolt 601, and in the illustrated embodiment, bolt 601 is a sixty millimeter (60 mm) bolt. Bolt 601 is inserted into channel 405 and the head of bolt 601 is tightened using a tool such a screwdriver (not herein shown). The process of tightening bolt 601 causes bolt 601 to engage with clamp mechanism 401. Clamp mechanism 401 is then drawn towards housing 301, thereby clamping housing 301 onto DIN rail (not herein shown).

Housing 301 comprises a recess to allow for varying degrees of tolerances from bolt manufacturers. The recess may be, for example, three quarters of a millimeter (0.75 mm). Clamp mechanism 401 is drawn directly towards housing 301 and does not itself rotate.

Different makes of tool, such as a screw driver, have varying degrees of insulation, and in general, the thickness of insulation increases towards the handle of the tool. In tools having a greater degree of insulation, the tool will not be able to physically reach as far down the channel inside the housing compared to tools having less insulation. However, bolt 601, which is sixty millimeters (60 mm) in length, allows for different makes of tool, having different degrees of insulation, to be inserted into channel 405 and still reach the head of bolt 601. However, it is also within the scope of the present invention that bolts of alternative lengths may be used (albeit with modifications required that are within the scope of the skilled person), in which case a tool having the appropriate amount of insulation so that the tool can be inserted into channel 405 and still reach the head of the bolt.

In the illustrated embodiment, channel 405 tapers internally from a diameter of six millimeters (6 mm) to five millimeters (5 mm), and is configured for use with bolt 601 with a head having a diameter of five point four millimeters (5.4 mm). During the initial assembly the bolt is forced past this taper. This internal tapering of channel 405 therefore acts as a mechanism to prevent bolt 601 from falling out of housing 301 should bolt 601 be loosened from the clamp mechanism 401. Other degrees of tapering are also within the scope of the present invention.

Figure 6B:
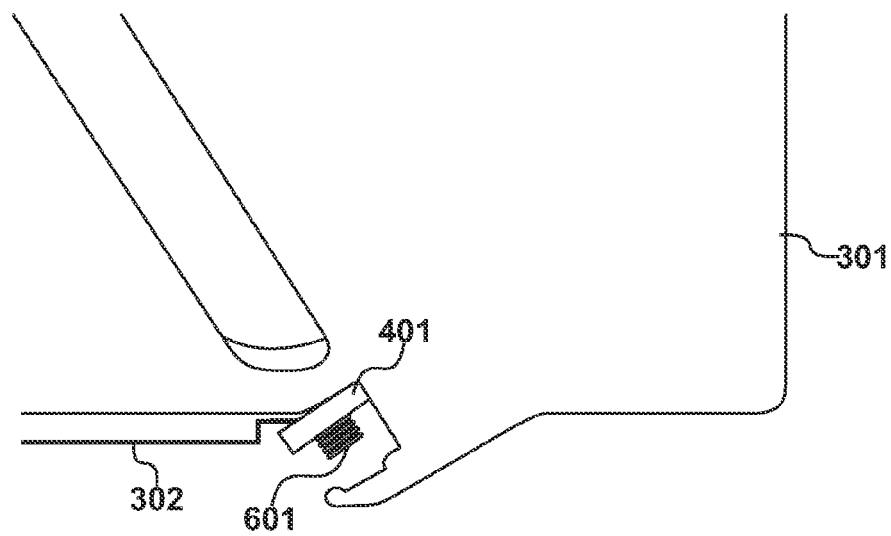

FIG. 6B shows a close up view of bolt 601 engaging with clamp mechanism 401, and clamp mechanism 401 engaging with DIN rail 302. Engagement of clamp mechanism 401 with DIN rail 302 secures housing 301 to DIN rail 302.
FIG. 7

Figure 7A:
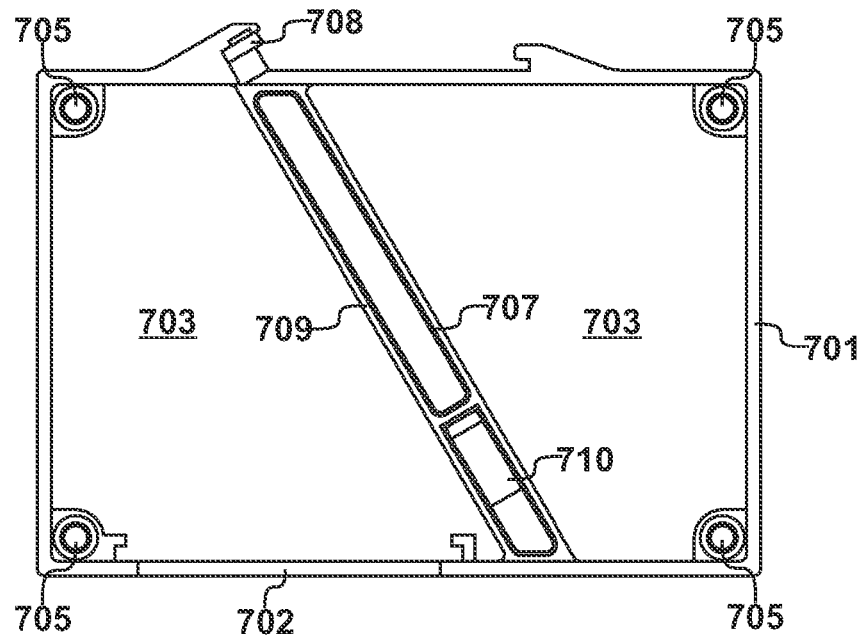
FIGS. 7A and 7B illustrate a plan view of an alternative embodiment of the present invention.
Figure 7B:
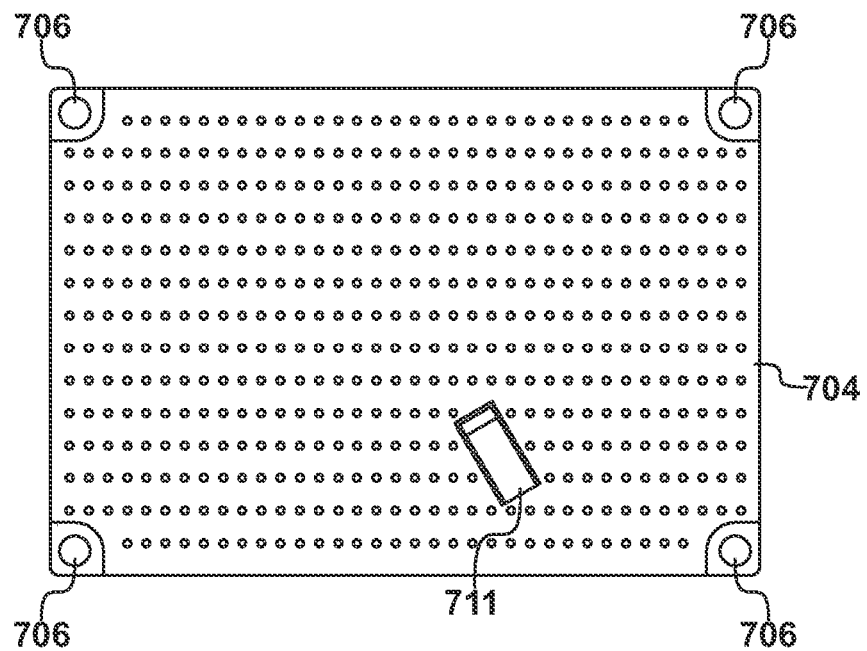

An alternative embodiment of the apparatus embodied in the present invention is shown in FIGS. 7A and 7B in plan view. The apparatus of FIGS. 7A and 7B is substantially similar to that as previously shown and differs only in the arrangement of the clamp mechanism as will now be described.

The apparatus is shown in FIG. 7A in an empty state with no desiccant within the apparatus. The apparatus comprises housing 701 which is configured for attachment to a rail inside an electrical enclosure in the manner shown in previous FIG. 3. Housing 701 is configured to receive a desiccant in a substantially similar manner to the previous embodiment. The desiccant is used to absorb humidity and may be silica gel or an alternative desiccant which is suitable for use in electrical enclosures of the types previously indicated.

The apparatus comprises a transparent window 702 which is used to view the desiccant when it is placed within a cavity 703 of the housing 701 in a similar manner to that described in FIG. 5B. FIG. 7A illustrates the apparatus with the lid 704 removed, which is shown in FIG. 7B. In use, and when filled with desiccant, lid 704 is placed on top of housing 701 and attached to housing 704 by utilizing holes 705 in housing 701 and corresponding holes 706 in lid 704. Holes 705 and 706 respectively are configured to receive screws which attach lid 704 to housing 701.

Referring to FIG. 7A, lid 704 has been removed to reveal channel 707. In a similar manner to the embodiment described in respect of FIGS. 5 and 6, a tool such as a screwdriver is inserted into channel 707 to tighten a bolt, which engages with a clamp mechanism 708. Clamp mechanism 708 is drawn towards housing 701 which thereby clamps housing 701 to an industry standard rail such as a DIN rail.

Channel 707 comprises a first portion 709 which provides a closed channel and a second portion 710 which provides an open channel. The open channel provides for easy insertion of a bolt for tightening the clamp mechanism 708 as will be described in further detail in FIG. 8.

Figure 8:
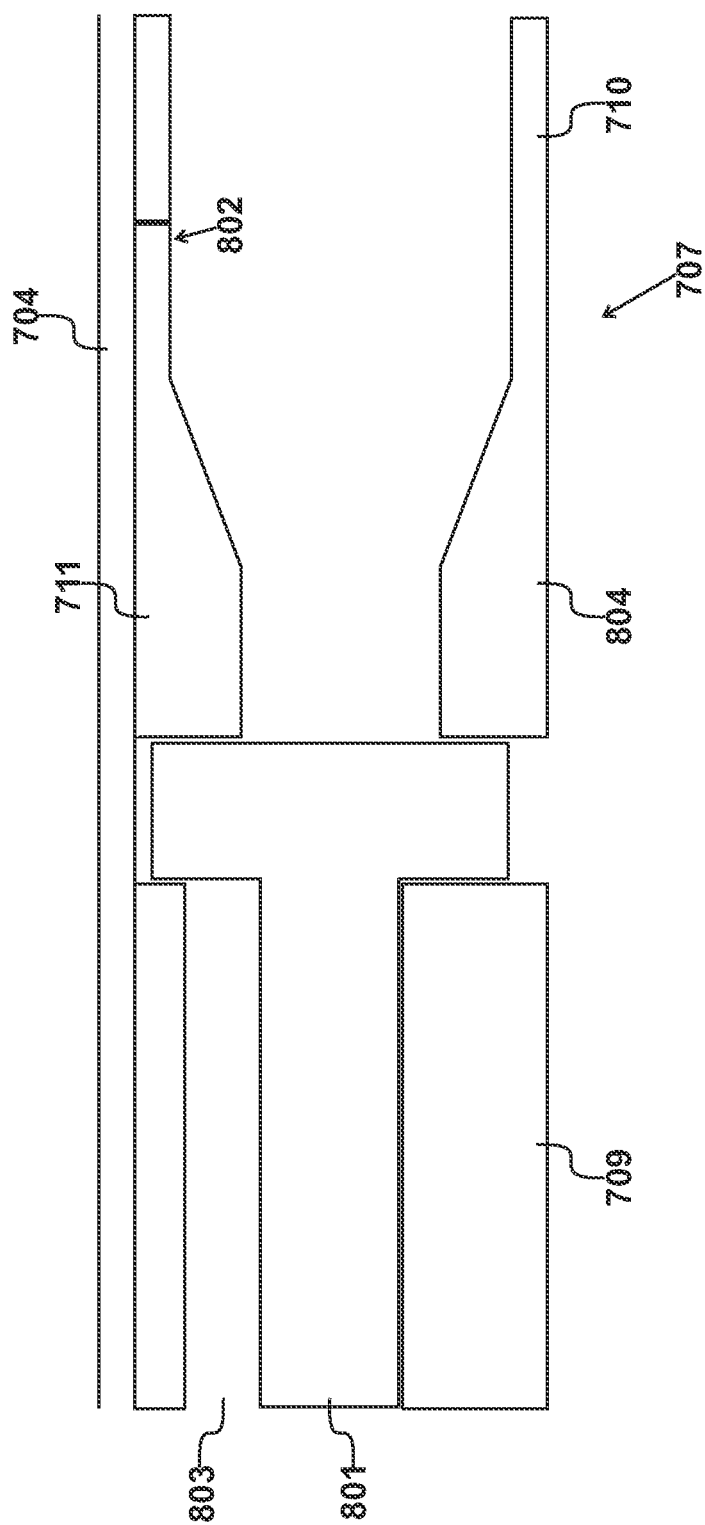
FIG. 8 shows a cross sectional view of the embodiment of FIG. 7.

A corresponding channel closure portion 711 is provided and fixed to lid 704 as illustrated in FIG. 7B. When lid 704 is attached to housing 701, closure portion 711 fits into the aperture of open channel 710.
FIG. 8

A cross sectional view of channel 707 is illustrated in FIG. 8 where housing 701 has lid 704 fitted thereto. Closed channel 709 is shown with a bolt 801 inserted therein. Open channel 710 is shown with closure portion 711 in place in aperture 802 given that lid 704 has been attached to housing 701.

Bolt 801 is positioned in closed channel 709 when lid 704 is removed from housing 701. As closure portion 711 does not form part of channel 707 when lid 704 has been removed, bolt 801 can be angled into the space of closed channel 709 which has a wider diameter than the diameter of the body of bolt 801 giving a clearance gap 803. For example, in the embodiment, closed channel 709 has an internal diameter of four millimeters (4 mm). In comparison, the open channel 710 has a widest diameter of six millimeters (6 mm) and tapers to a diameter of four millimeters (4 mm).

Thus, in order to activate the clamp mechanism 708 in this alternative embodiment, bolt 801 is inserted into the housing 701 and bypasses tapered section 804. When lid 704 is replaced, bolt 801 is encased within housing 701 and cannot fall out. In turn this reduces the amount of wear on the housing. It is appreciated that bolt 801 is tightened in a substantially similar manner to that of bolt 601 in FIG. 6.

What we claim is:

1. Apparatus for absorbing humidity inside an electrical enclosure and indicating absorption of said humidity, comprising:
    a housing for a desiccant,
    said housing being configured for attachment to a rail inside said electrical enclosure; and
    said housing comprising:
        a transparent window;
        a channel configured for receiving a bolt; and
        a clamp mechanism at a base of said channel for securing said housing onto said rail.

2. Apparatus according to claim 1, wherein said housing comprises a desiccant therein and said desiccant is indicating silica gel in a bead form.

3. Apparatus according to claim 2, wherein said silica gel undergoes a color change upon absorption of humidity.

4. Apparatus according to claim 1, wherein said housing comprises a lid configured for removal by a tool.

5. Apparatus according to claim 4, wherein removal of said lid allows replacement of desiccant in said housing.

6. Apparatus according to claim 4, wherein said lid comprises a plurality of air ventilation holes.

7. Apparatus according to claim 6, wherein said plurality of air ventilation holes are each substantially 0.5 mm in diameter.

8. Apparatus according to claim 1, further wherein said channel is configured for receiving a tool for engaging with head of said bolt.

9. Apparatus according to claim 1, wherein said channel is tapered as it extends towards said clamp mechanism.

10. Apparatus according to claim 1, wherein said housing is composed of polycarbonate.

11. An electrical enclosure comprising a rail wherein the housing of the apparatus of claim 1 is attached to said rail.

12. An electrical enclosure according to claim 11, wherein said rail is a top hat terminal rail.

13. Apparatus according to claim 11, wherein said transparent window is visible when housing is attached to said rail inside said electrical enclosure.

14. A method of attaching apparatus according to claim 1 to a rail inside said electrical enclosure, comprising the following steps:
    i) inserting a bolt into a channel on said housing;
    ii) tightening said bolt within said channel using a tool;
    iii) allowing said bolt to engage with said clamp mechanism at said base of said channel; and
    iv) drawing said clamp mechanism towards housing.

15. A method according to claim 14, wherein said channel tapers as it extends towards said clamp mechanism.

16. A method according to claim 14, wherein said tool is a screwdriver.

17. A method according to claim 14, wherein said bolt has a head having a wider diameter than the smallest diameter of said channel.

* * * * *